United States Patent
Reiter et al.

(10) Patent No.: US 11,937,413 B2
(45) Date of Patent: Mar. 19, 2024

(54) POWER ELECTRONICS MODULE AND METHOD FOR FABRICATING A POWER ELECTRONICS MODULE

(71) Applicant: Infineon Technologies AG, Neubiberg (DE)

(72) Inventors: Tomas Manuel Reiter, Munich (DE); Elvis Keli, Bad Sassendorf (DE)

(73) Assignee: Infineon Technologies AG, Neubiberg (DE)

( * ) Notice: Subject to any disclaimer, the term of this patent is extended or adjusted under 35 U.S.C. 154(b) by 143 days.

(21) Appl. No.: 17/675,446

(22) Filed: Feb. 18, 2022

(65) Prior Publication Data

US 2022/0287209 A1    Sep. 8, 2022

(30) Foreign Application Priority Data

Mar. 4, 2021   (DE) .......................... 102021105264.5

(51) Int. Cl.
*H05K 7/20*   (2006.01)
*H01L 23/36*  (2006.01)
(Continued)

(52) U.S. Cl.
CPC ......... *H05K 7/20927* (2013.01); *H01L 23/36* (2013.01); *H01L 25/0655* (2013.01); *H02M 1/327* (2021.05)

(58) Field of Classification Search
CPC ..... H05K 1/0201–0212; H05K 1/0272; H05K 1/181–188; H05K 7/1432;
(Continued)

(56) References Cited

U.S. PATENT DOCUMENTS

| | | | | |
|---|---|---|---|---|
| 5,424,580 A | * | 6/1995 | Tustaniwskyj | H01L 23/367 257/713 |
| 5,521,437 A | * | 5/1996 | Oshima | H05K 1/142 257/E23.172 |

(Continued)

FOREIGN PATENT DOCUMENTS

| | | | | |
|---|---|---|---|---|
| DE | 19645635 C1 | * | 4/1998 | ............. B60K 11/06 |
| DE | 69417300 T2 | | 4/1999 | |
| DE | 102004018477 A1 | * | 11/2005 | ............. H01L 24/24 |

OTHER PUBLICATIONS

Trapezoidal Control of BLDC Motors Using Hall Effect Sensors (Year: 2011).*

(Continued)

*Primary Examiner* — Amir A Jalali
(74) *Attorney, Agent, or Firm* — Murphy, Bilak & Homiller, PLLC

(57) ABSTRACT

A power electronics module includes at least one first substrate having on a first side one or more first semiconductor dies, the one or more first semiconductor dies and the at least one first substrate providing a higher power part of the power electronics module, at least one second substrate having on a first side one or more second semiconductor dies, the one or more second semiconductor dies and the at least one second substrate providing a lower power part of the power electronics module, and a common frame at least partially encasing the first and second substrates and being a monobloc part, the higher power part being configured for direct liquid cooling and the lower power part being configured for indirect cooling.

19 Claims, 4 Drawing Sheets

(51) Int. Cl.
*H01L 25/065* (2023.01)
*H02M 1/32* (2007.01)

(58) Field of Classification Search
CPC .......... H05K 7/20272; H05K 7/20872; H05K 7/20927; H05K 7/20945; H05K 2201/064; H05K 2201/10166; H01L 23/296; H01L 23/3135; H01L 23/34; H01L 23/36–3675; H01L 23/4006; H01L 23/46; H01L 23/473; H01L 23/4952; H01L 23/49537; H01L 23/49541; H01L 23/49575; H01L 23/49562; H01L 23/538; H01L 23/668; H01L 23/676; H01L 23/50; H01L 24/48; H01L 24/73; H01L 25/0655; H01L 25/072; H01L 25/165; H01L 25/18; H01L 25/50; H01L 25/62; H01L 2224/48101; H01L 2224/48108; H01L 2224/48137; H01L 2224/49112; H02M 1/327; H02M 7/00; H02M 7/53875

See application file for complete search history.

(56) References Cited

U.S. PATENT DOCUMENTS

| | | | | |
|---|---|---|---|---|
| 8,120,153 | B1* | 2/2012 | Shen | H01L 23/49537 257/789 |
| 9,406,624 | B2* | 8/2016 | Yoneyama | H01L 23/552 |
| 2002/0060371 | A1* | 5/2002 | Lang | H01L 25/072 257/785 |
| 2005/0128706 | A1* | 6/2005 | Maly | H01L 24/49 257/E23.098 |
| 2012/0014059 | A1* | 1/2012 | Zeng | H05K 5/065 361/730 |
| 2012/0014069 | A1* | 1/2012 | Zeng | H01L 25/115 29/841 |
| 2012/0175755 | A1* | 7/2012 | Bayerer | H01L 23/36 438/122 |
| 2012/0218716 | A1* | 8/2012 | Asakura | H01L 23/4006 361/717 |
| 2013/0069210 | A1* | 3/2013 | Lee | H01L 23/49531 257/E23.042 |
| 2016/0111345 | A1* | 4/2016 | Kawase | H01L 23/3675 257/706 |
| 2019/0200485 | A1* | 6/2019 | Coteus | H01L 23/367 |
| 2019/0279917 | A1* | 9/2019 | Gohara | F28F 3/025 |
| 2020/0144147 | A1 | 5/2020 | Muto et al. | |
| 2021/0125904 | A1* | 4/2021 | Sugimachi | H01L 23/4334 |
| 2023/0238374 | A1* | 7/2023 | Schmenger | H01L 21/4882 257/712 |

OTHER PUBLICATIONS

DE-19645635-C1 English Translation (Year: 1998).*
DE-102004018477-A1 English Translation (Year: 2004).*

* cited by examiner

POWER ELECTRONICS MODULE AND METHOD FOR FABRICATING A POWER ELECTRONICS MODULE

TECHNICAL FIELD

This disclosure relates in general to a power electronics module, in particular a power electronics module comprising a higher power part and a lower power part, as well as to a method of fabrication thereof.

BACKGROUND

Different electronic modules may be used for variety of purposes in a particular appliance. For example, in automotive applications, electronic modules may provide an electric fuse, a discharge circuit, a high voltage/low voltage DC/DC converter, an onboard charger, etc. For reasons of ease of assembly, it would be beneficial to combine several related functions for a particular appliance in a specifically designed, single electronic module. However, such appliance specific modules may require additional development and fabrication efforts which may increase their costs significantly. Improved power electronic modules as well as improved methods for fabricating power electronic modules may help with solving these and other problems.

The problem on which the invention is based is solved by the features of the independent claims. Further advantageous examples are described in the dependent claims.

SUMMARY

Various aspects pertain to a power electronics module, comprising: at least one first substrate comprising on a first side one or more first semiconductor dies, the one or more first semiconductor dies and the at least one first substrate providing a higher power part of the power electronics module, at least one second substrate comprising on a first side one or more second semiconductor dies, the one or more second semiconductor dies and the at least one second substrate providing a lower power part of the power electronics module, and a common frame at least partially encasing the first and second substrates and being a monobloc part, wherein the higher power part is configured for direct liquid cooling and wherein the lower power part is configured for indirect cooling.

Various aspects pertain to a method for fabricating a power electronics module, the method comprising: providing at least one first substrate comprising on a first side one or more first semiconductor dies, providing at least one second substrate comprising on a first side one or more second semiconductor dies, and encasing the first and second substrates in a common frame, the common frame being a monobloc part, wherein the one or more first semiconductor dies and the at least one first substrate provide a higher power part of the power electronics module and the one or more second semiconductor dies and the at least one second substrate provide a lower power part of the power electronics module, and wherein the higher power part is configured for direct liquid cooling and the lower power part is configured for indirect cooling.

BRIEF DESCRIPTION OF THE DRAWINGS

The accompanying drawings illustrate examples and together with the description serve to explain principles of the disclosure. Other examples and many of the intended advantages of the disclosure will be readily appreciated in view of the following detailed description. The elements of the drawings are not necessarily to scale relative to each other. Identical reference numerals designate corresponding similar parts.

DETAILED DESCRIPTION

In the following detailed description, directional terminology, such as "top", "bottom", "left", "right", "upper", "lower" etc., is used with reference to the orientation of the Figure(s) being described. Because components of the disclosure can be positioned in a number of different orientations, the directional terminology is used for purposes of illustration only.

Furthermore, to the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements cooperate or interact with each other regardless whether they are in direct physical or electrical contact, or they are not in direct contact with each other; intervening elements or layers may be provided between the "bonded", "attached", or "connected" elements. However, it is also possible that the "bonded", "attached", or "connected" elements are in direct contact with each other. Also, the term "exemplary" is merely meant as an example, rather than the best or optimal.

The examples of a power electronics module described below may use various types of semiconductor chips or circuits incorporated in the semiconductor chips, among them AC/DC or DC/DC converter circuits, power MOSFET transistors, power Schottky diodes, JFETs (Junction Gate Field Effect Transistors), power bipolar transistors, logic integrated circuits, analogue integrated circuits, mixed signal integrated circuits, sensor circuits, MEMS (Micro-Electro-Mechanical-Systems), power integrated circuits, chips with integrated passives, etc. The examples may also use semiconductor chips comprising MOS transistor structures or vertical transistor structures like, for example, IGBT (Insulated Gate Bipolar Transistor) structures.

An efficient power electronics module may for example reduce material consumption, ohmic losses, chemical waste, etc. and may thus enable energy and/or resource savings. Improved power electronics modules and improved methods for fabricating power electronic modules, as specified in this description, may thus at least indirectly contribute to green technology solutions, i.e. climate-friendly solutions providing a mitigation of energy and/or resource use.

Figure 1:
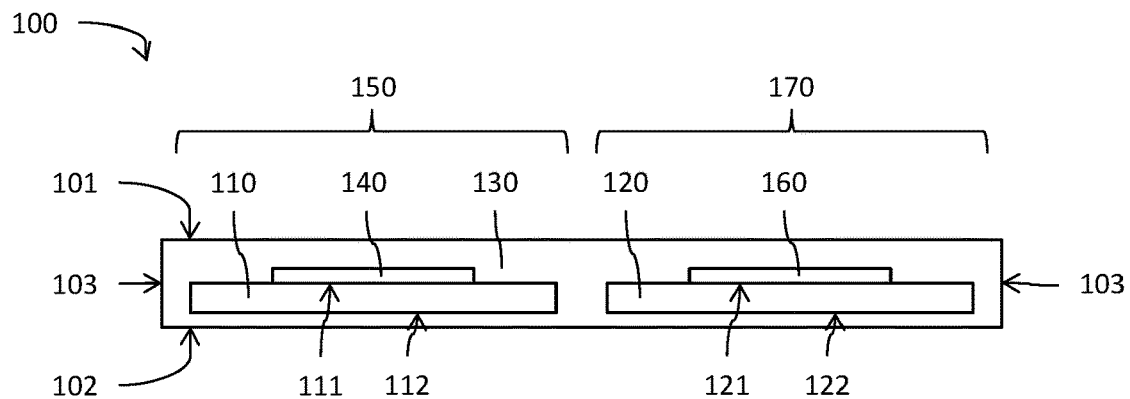
FIG. 1 shows a sectional view of a power electronics module comprising in a common frame a higher power part and a lower power part.

FIG. 1 shows a power electronics module 100 comprising at least one first substrate 110, at least one second substrate 120 and a common frame 130 at least partially encasing the first and second substrates 110, 120.

The at least one first substrate 110 comprises a first side 111 and it may comprise an opposite second side 112. One or more first semiconductor dies 140 are arranged on the first side 111. The one or more first semiconductor dies 140 and the at least one first substrate 110 provide a higher power part 150 of the power electronics module 100.

The at least one second substrate 120 comprises a first side 121 and it may comprise an opposite second side 122. One or more second semiconductor dies 160 are arranged on the first side 121. The one or more second semiconductor dies 160 and the at least one second substrate 120 provide a lower power part 170 of the power electronics module 100.

The first and second substrates 110, 120 may be any suitable type of substrate and they may be of the same type or of different types of substrates. The first and/or second substrate 110, 120 may for example be of the type direct aluminum bond (DAB), or direct copper bond (DCB), or active metal brazing (AMB), or insulated metal substrate (IMS), or printed circuit board (PCB).

The first and second substrates 110, 120 may for example be arranged laterally next to each other. This may mean that the first and second substrates 110, 120 comprise lateral sides connecting the first and second sides 111, 112, respectively 121, 122 and that lateral sides of the first and second substrates 110, 120 face each other. According to an example, the first and second substrates 110, 120 are arranged in a common plane. Furthermore, the first sides 111, 121 of the first and second substrates 110, 120 may have the same orientation.

According to an example, the power electronics module 100 comprises several first substrates 110 and/or several second substrates 120. In this case, all first substrates 110 may be arranged on one side of the power electronics module 100 (e.g. to the left in FIG. 1) and all second substrates 120 may be arranged on another side of the power electronics module 100 (e.g. to the right in FIG. 1).

In the case that the power electronics module 100 comprises several first semiconductor dies 140, these may all be identical dies or they may be different types of dies. The same applies to the second semiconductor dies 160.

The one or more first semiconductor dies 140 may for example be power semiconductor dies, configured to operate with a high voltage and/or a heavy current. The one or more second semiconductor dies 140 may for example also be power semiconductor dies. However, they may instead be configured to operate with a comparatively lower voltage and/or a smaller current.

The common frame 130 at least partially encases the first and second substrates 110, 120. In this context, "encase" may mean that the common frame 130 completely surrounds outwards facing lateral sides of the first and second substrates 110, 120. The common frame 130 may also encase the first and second semiconductor dies 140, 160. Furthermore, the common frame 130 is a monobloc part. This may in particular mean that the common frame is made in one piece or that it comprises a single, dimensionally stable, piece which encases the first and second substrates 110, 120.

The common frame 130 may e.g. be a plastic frame, in particular a thermoplastic frame (in this context, a plastic may be an essentially rigid plastic). The plastic may be any suitable type of plastic. The common frame 130 may be a molded part. The common frame 130 may be configured to keep the first and second substrates 110, 120 in place relative to each other.

According to an example, fixing means, e.g. clamps, pins, rivets, screws, solderable parts, etc. are connected to the common frame 130. The fixing means are configured to fix the first and second substrates 110, 120 to the common frame 130.

The common frame 130 may be part of an encapsulation of the power electronics module 100, wherein the encapsulation is configured to encapsulate the first and second semiconductor dies 140, 160 and/or the first and second substrates 110, 120 and to protect them from environmental influences.

The power electronics module 100 may have a first side 101, an opposite second side 102 and lateral sides 103 connecting the first and second sides 101, 102. The first side 101 may comprise first external contacts of the power electronics module 100 (not shown). The first external contacts may for example be control contacts configured to transmit control signals between the power electronics module 100 and an external appliance. One or more of the lateral sides 103 (e.g. opposite lateral sides 103) may comprise second external contacts of the power electronics module 100. The second external contacts may e.g. be power contacts.

The second side 102 of the power electronics module 100 may be configured to be coupled to a heatsink. The heatsink may e.g. comprise a fluid channel for a cooling fluid. As disclosed in greater detail further below, a baseplate may be arranged below that part of the second side 102 which lies essentially below the higher power part 150. According to an example, the baseplate does not extend into the part of the second side 102 which lies essentially below the lower power part 170. Instead, a layer of thermal interface material may be arranged below the lower power part 170.

In particular, the higher power part 150 is configured for direct liquid cooling and the lower power part 170 is configured for indirect cooling. "Configured for direct liquid cooling" may mean that the at least one first substrate 110 or, in case a baseplate is arranged below the at least one first substrate 110, the baseplate, is configured to come into direct contact with a cooling liquid of a fluid channel. "Configured for indirect cooling" may mean that a thermal gap pad or a layer of thermal interface material is arranged between the at least one second substrate 120 and the heatsink.

The higher power part 150 may comprise a first circuitry of the power electronics module 100 and the lower power part 170 may comprise a different second circuitry. The first and the second circuitry may be functionally interrelated. A power loss of the first circuitry of the higher power part 150 may for example be at least three times higher than a power loss of the second circuitry of the lower power part 170. For example, the higher power part 150 may be configured to operate with a current in the range of 400 $A_{rms}$ to 800 $A_{rms}$, whereas the lower power part 170 may be configured to operate with a current in the range of 30 $A_{rms}$ to 100 $A_{rms}$.

Since the power electronics module 100 houses both the first and the second circuitry in a common frame, the assembly process of coupling these circuitries to an external appliance is simplified compared to the case that two separate modules were used. Furthermore, the lower power part 170 may essentially be a low cost "standardized extension area" of the power electronics module 100, which provides room for different, application specific types of lower power circuitry. The power electronics module 100 may therefore easily be adapted for use in different applications without costly modifications to it.

Figure 2:
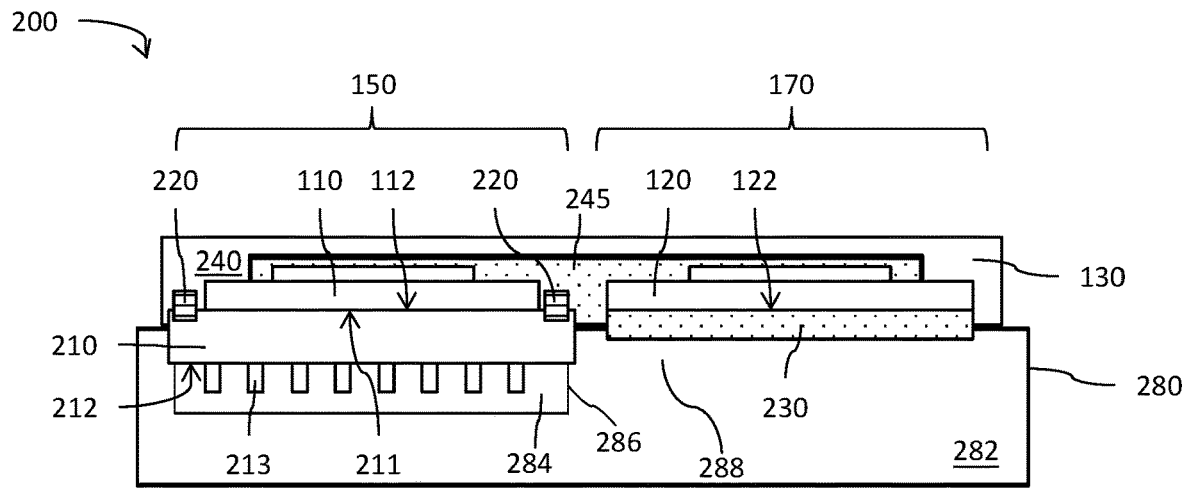
FIG. 2 shows a sectional view of a further power electronics module, wherein a substrate of the higher power part is arranged on a baseplate coupled to the common frame and wherein a substrate of the lower power part is arranged on a thermal gap pad.

FIG. 2 shows a further power electronics module 200 which may be similar to or identical with the power electronics module 100. The power electronics module 200 comprises a baseplate 210 arranged below the at least one first substrate 110, in particular such that the second side 112 of the at least one first substrate 110 faces the baseplate 210.

According to an example, a solder layer is arranged between the baseplate 210 and the second side 112 of the first substrate 110, wherein the solder layer mechanically and thermally couples the first substrate 110 to the baseplate 210. According to another example, equivalent fixing means, e.g. (conductive) glue may be used to couple the first substrate 110 to the baseplate 210.

As shown in FIG. 2, the baseplate 210 is essentially arranged below the higher power part 150 of the power electronics module 200. The baseplate 210 does not extend below the lower power part 170 or it extends below the lower power part 170 only to a small extent (for example, the baseplate covers no more than 30% or no more than 20% or no more than 10% of the surface area below the lower power part 170).

The baseplate 210 may be configured to act as a heat spreader for the higher power part 150. The baseplate 210 may comprise or consist of any suitable material, e.g. a metal like Al or Cu or a metal alloy. The baseplate 210 may have any suitable dimensions and any suitable shape, e.g. an essentially rectangular shape.

The baseplate 210 may comprise an upper side 211 and a lower side 212, wherein the upper side 211 faces the first substrate 110 and the lower side 212 faces away from the substrate 110. The lower side 212 is configured to be in direct contact with a cooling liquid. The lower side 212 may comprise a plurality of cooling fins 213 configured to improve a heat transfer from the baseplate 210 to the cooling fluid. The lower side 212 may also comprise a sealing ring (not shown) surrounding the cooling fins 213, the sealing ring being configured to seal the interface between the baseplate 210 and the fluid channel.

According to an example, the baseplate 210 is mechanically fixed to the common frame 130 by fixing means 220. The fixing means 220 may for example comprise screws, rivets, clamps, etc.

As shown in FIG. 2, the power electronics module 200 may comprise a thermal gap pad 230 arranged below the at least one second substrate 120. The thermal gap pad 230 may be in direct contact with the second side 122 of the at least one second substrate 120. The material of the thermal gap pad 230 may e.g. be a paste or it may be a pad or cushion. Additionally or alternatively, a thermal interface material (TIM) layer may be used in place of the thermal gap pad 230. The TIM layer may e.g. be applied when the power electronics module 200 is coupled to an external appliance. The thermal gap pad 230 may e.g. be arranged on the at least one second substrate 120 during fabrication of the power electronics module 200.

According to an example, the power electronics module 200 comprises several second substrates 120, wherein each one is coupled to its own thermal gap pad 230. According to another example, several or all second substrates 120 are coupled to the same thermal gap pad 230.

The common frame 130 may be configured such that a lower surface of the thermal gap pad 230 is exposed to the outside and may be brought into contact with a heatsink 280. According to an example, the thermal gap pad 230 may be arranged on the same heatsink 280, e.g. the same fluid channel 282, as the baseplate 210. However, the baseplate 210 is configured to directly contact a cooling fluid 284 within the channel 282 and act as a lid for a cavity 286 of the fluid channel 282, whereas the thermal gap pad 230 may be arranged on a channel wall 288. As shown in FIG. 2, the lower side 212 of the baseplate 210 and a lower side of the thermal gap pad 230 may be arranged in different planes.

The common frame 130 may define at least one cavity 240, wherein the first and second semiconductor dies 140, 160 and possibly also the first and second substrates 110, 120 are arranged within the at least one cavity 240. It is possible that the power electronics module 200 comprises separate cavities for the higher power part 150 and for the lower power part 170.

According to an example, the at least one cavity 240 is at least partially filled with a protective layer 245 configured to protect the first and second semiconductor dies 140, 160 from outside influences. The protective layer may for example comprise a gel or polymer material.

Figure 3:
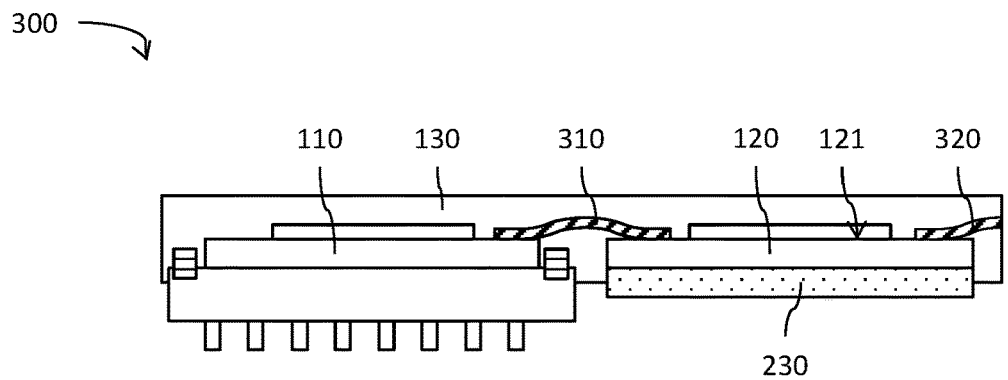
FIG. 3 shows a sectional view of a further power electronics module, wherein the substrate of the lower power part is coupled to spring elements.

FIG. 3 shows a further power electronics module 300 which may be similar to or identical with the power electronics module 200. In addition to the components disclosed with regard to power electronics module 200, the power electronics module 300 also comprises a plurality of spring elements 310, 320.

The spring elements 310, 320 may be configured to exert a downward force onto the first side 121 of the at least one second substrate 120. The spring elements 310, 320 may in particular be configured to press the at least one second substrate 120 against the thermal gap pad 230. The spring elements 310, 320 may therefore help with establishing a proper thermal contact between the second substrate 120 and the thermal gap pad 230.

The spring elements 310, 320 (e.g. an upper part of the spring elements 310, 320) may be fixed to the common frame 130 (e.g. mechanically fixed or glued to the common frame 130). A lower part of the spring elements 310, 320 may be fixed to the at least one second substrate 120. For example, the lower part may be welded or soldered to the first side 121 of the at least one second substrate 120. In the case that the power electronics module 300 comprises several second substrates 120, each second substrate 120 may be coupled to several spring elements 310, 320.

According to an example, the spring elements 310, 320 are metal clips with an essentially gull wing shape. The spring elements 310, 320 may comprise or consist of any suitable metal, e.g. Al or Cu, or a metal alloy.

The power electronics module 300 may comprise one or more first spring elements 310 and one or more second spring elements 320. The first spring elements 310 may be configured to act as electrical connectors in addition to applying a spring force onto the second substrate 120. The second spring elements 320 are not configured to act as electrical connectors. The first and second spring elements 310, 320 may essentially be structurally identical, the only difference being that the second spring elements 320 do not have an electrical function (they may therefore also be termed "dummy connectors").

According to an example, the power electronics module 300 comprises first spring elements 310 but no second spring elements 320 and according to another example, the power electronics module 300 comprises second spring elements 320 but no first spring elements 310.

The first spring elements 310 may for example be configured as electrical connectors for a direct current. The first spring elements 310 may be configured to electrically couple the at least one second substrate 120 to at least one first substrate 110 and/or to external contacts of the power electronics module 300. For example, part of an electrical circuitry on the at least one second substrate 120 may be electrically coupled by a first spring element 310 to part of an electrical circuitry on at least one first substrate 110.

Figure 4A:
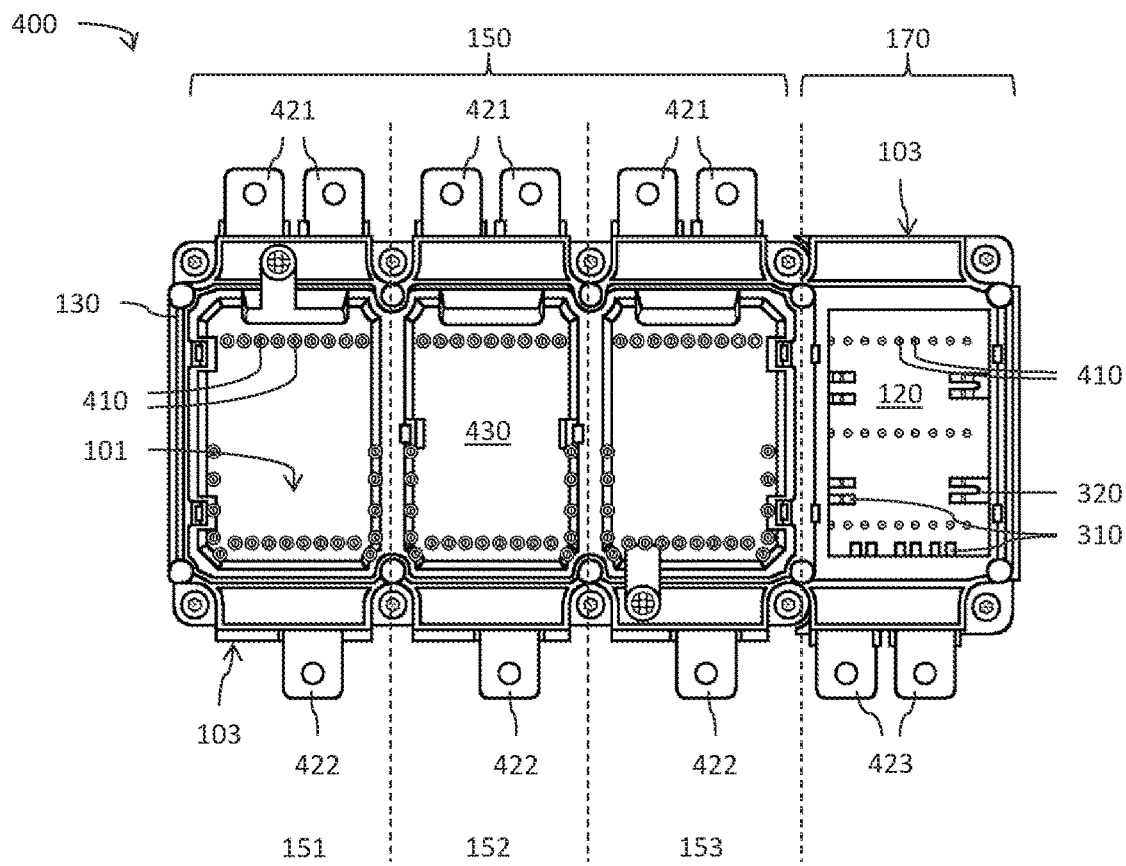
FIGS. 4A and 4B show a top view and a bottom view, respectively, of a further power electronics module.
Figure 4B:
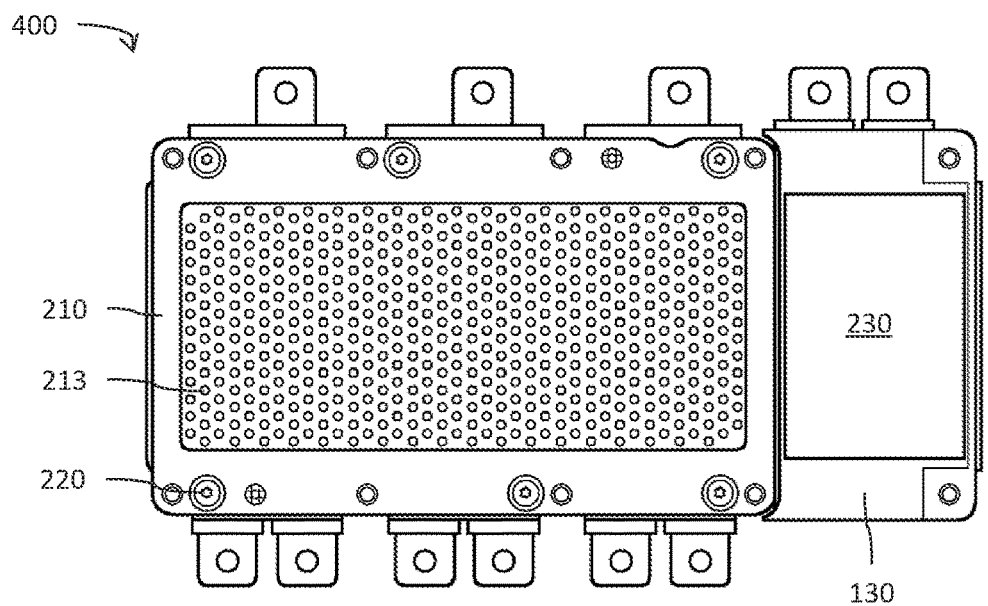

FIGS. 4A and 4B show a further power electronics module 400 which may be similar to or identical with the power electronics modules 100, 200 and 300. FIG. 4A shows a top view and FIG. 4B shows a bottom view.

As shown in FIG. 4A, the power electronics module 400 may comprise a plurality of first external contacts 410 which may be control contacts. The first external contacts 410 may be arranged on the first side 101 of the power electronics module 400. The first external contacts 410 may be pressfit pins.

The power electronics module 400 may comprise second external contacts 421, 422, 423 which may be power contacts. The second external contacts 421, 422, 423 may e.g. be configured to be screwed or riveted to an external appliance. The second external contacts 421, 422, 423 may be arranged along opposite lateral sides 103 of the power electronics module 400. A first and a second group 421, 422 of the second external contacts may consist of contacts of the higher power part 150. The first group 421 of second external contacts may be configured as contacts for a positive and negative DC voltage. The second group 422 of second external contacts may for example be configured as contacts for a three-phase AC. A third group 423 of second external contacts may consist of power contacts of the lower power part 170.

According to an example, the higher power part 150 comprises several subparts which together provide the circuitry of the higher power part 150. The higher power part 150 may for example comprise three subparts 151, 152, 153 (indicated by dashed lines in FIG. 4A). Each subpart 151, 152, 153 may comprise a first substrate 110, one or more first semiconductor dies 140 arranged on said first substrate 110, first external contacts 410 and second external contacts 421, 422.

The power electronics module 400 may comprise one or more lids 430 arranged on the first side 101 of the power electronics module 400. The lid(s) 430 may be configured to cover the at least one cavity 240 comprising the higher power part 150 and the lower power part 170. The lid(s) 430 may e.g. consist of the same material as the common frame 130 and the lid(s) 430 may be configured to be fixed to the common frame 130. The first external contacts 410 may extend through holes in the lid(s) 430. The power electronics module 400 may for example comprise two lids 430: a first lid 430 covering the higher power part 150 and a second lid 430 covering the lower power part 170.

In the example shown in FIG. 4A, a lid 430 covering the higher power part 150 but no lid 430 covering the lower power part 170 is shown. For this reason, the second substrate 120 as well as the first and second spring elements 310, 320 are visible in the lower power part 170.

As shown in FIG. 4B, the baseplate 210 may essentially cover the whole part of the second side 102 below the higher power part 150. The thermal gap pad 230 may e.g. cover more than 50%, more than 70% or more than 90% of the part of the second side 102 below the lower power part 170.

FIGS. 5A to 5D show the power electronics module 400 in various stages of fabrication according to an exemplary method for fabricating power electronics modules. A similar method may be used to fabricate the power electronics modules 100, 200 and 300.

Figure 5A:
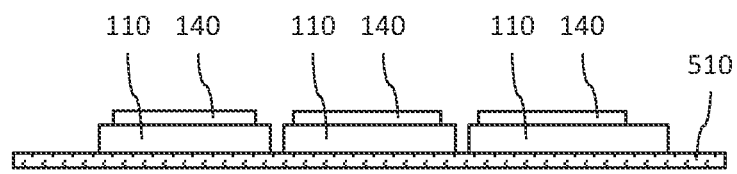
FIGS. 5A to 5D show sectional views of the power electronics module of FIGS. 4A and 4B in various stages of fabrication, according to an exemplary method for fabricating a power electronics module.

As shown in FIG. 5A, first substrates 110 are provided. The first substrates 110 may for example be arranged laterally next to each other on a temporary carrier 510, e.g. a tape. The first semiconductor dies 140 and optional further devices (e.g. diodes, NTCs, sleeves for pins, pins, etc.) may be coupled to the first substrates 110.

Figure 5B:
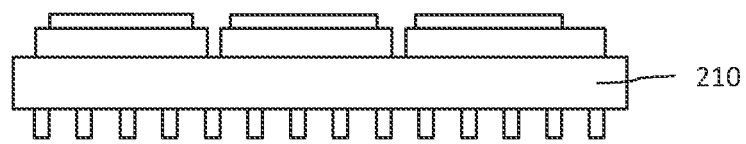

As shown in FIG. 5B, the first substrates 110 may be arranged on and mechanically and thermally coupled to the baseplate 210. Coupling the first substrates 110 to the baseplate 210 may for example comprise a soldering process.

Figure 5C:
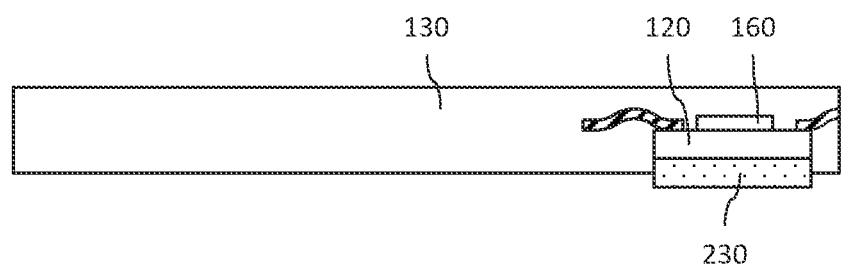

As shown in FIG. 5C, the second substrate 120 with the second semiconductor die(s) 160 and the common frame 130 are provided. According to the example shown in FIG. 5C, the second substrate 120 may be coupled to the common frame 130 (e.g. by arranging the second substrate 120 within the cavity 240 and coupling it to the first and second spring elements 310, 320) prior to coupling the first substrates 110 to the common frame 130.

Furthermore, an electrical functionality test may be performed on the second substrate 120 and/or the second semiconductor die(s) 160 prior to coupling the first substrates 110 to the common frame 130. The higher power part 150 may be the most expensive part of the power electronics module 400, whereas the lower power part 170 may be significantly cheaper. It may therefore be beneficial to only couple a "known good" lower power part 170 to a higher power part 150. It is however also possible that an electrical functionality test, a visual inspection, etc. is only performed at a later stage, e.g. after assembly of the power electronics module 400 is done.

According to another example (not shown), the first and second substrates 110, 120 are coupled to the common frame 130 in the same act of the fabrication process. The first and second substrates 110, 120 may for example be coupled to the common frame 130 by a pick-and-place process.

According to the example shown in FIG. 5C, the thermal gap pad 230 is arranged on the second substrate 120 prior to coupling the first substrates 110 to the common frame 130. However, it is also possible that the thermal gap pad 230 is arranged on the second substrate 120 after the first and second substrates 110, 120 have been coupled to the common frame 130.

Figure 5D:
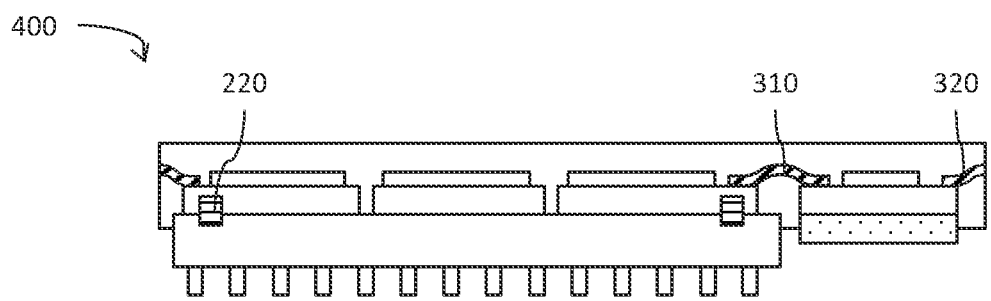

FIG. 5D shows the power electronics module 400 after the first substrates 110 and the baseplate 210 have been coupled to the common frame 130. This may e.g. comprise welding or soldering the first substrates 110 to electrical connectors or mechanical couplings like the spring elements 310, 320 and/or screwing, riveting or clamping the baseplate 210 to the common frame 130 with the fixing means 220.

Fabrication of the power electronics module 400 may comprise further acts not disclosed here, e.g. covering the semiconductor dies 140, 160 with a protective layer, covering the at least one cavity 240 with the lid(s) 430, etc.

Figure 6:
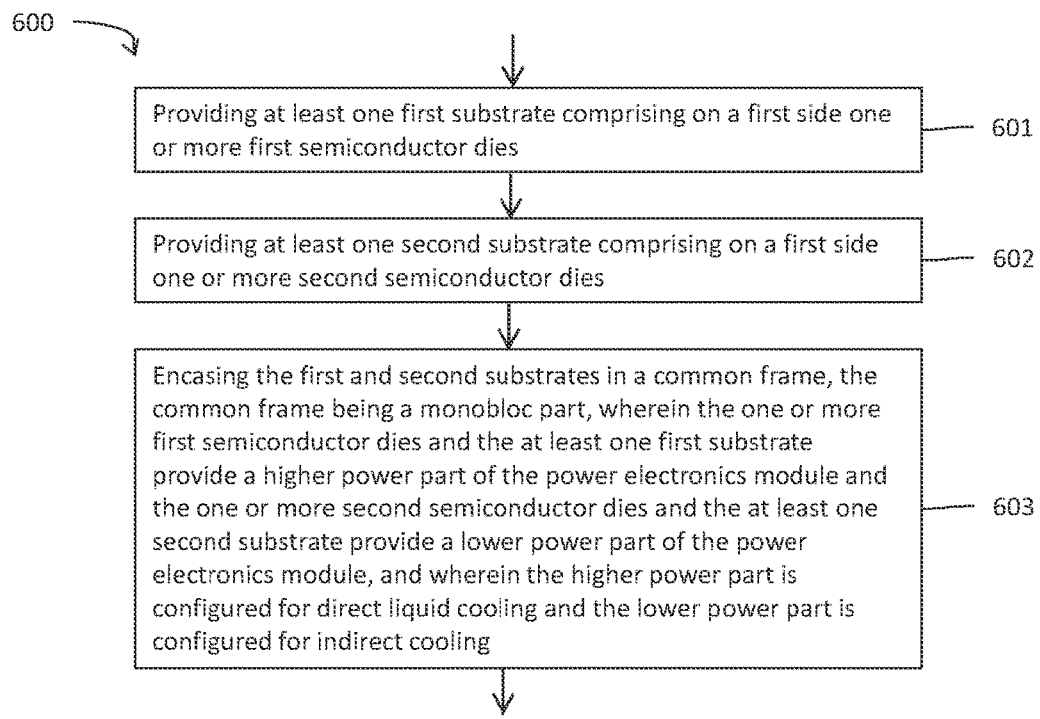
FIG. 6 is a flow chart of an exemplary method for fabricating a power electronics module.

FIG. 6 is a flow chart of a method 600 for fabricating a power electronics module, like, for example, the power electronics modules 100 to 400.

Method 600 comprises at 601 an act of providing at least one first substrate comprising on a first side one or more first semiconductor dies, at 602 an act of providing at least one second substrate comprising on a first side one or more second semiconductor dies, and at 603 an act of encasing the first and second substrates in a common frame, the common frame being a monobloc part, wherein the one or more first semiconductor dies and the at least one first substrate provide a higher power part of the power electronics module and the one or more second semiconductor dies and the at least one second substrate provide a lower power part of the power electronics module, and wherein the higher power part is configured for direct liquid cooling and the lower power part is configured for indirect cooling.

According to an example, the method 600 also comprises an act of coupling a second side of the at least one first substrate, the second side being opposite the first side, to a baseplate by soldering, sintering, or welding. The method 600 may also comprise an act of arranging a second side of the at least one second substrate, the second side being opposite the first side, on a thermal gap pad. The method 600 may also comprise an act of electrically and mechanically coupling the first and second substrates to electrical connectors fitted into the common frame. At least some of these electrical connectors may be configured as spring elements which exert a downward force onto the first side of the at least one second substrate.

Figure 7:
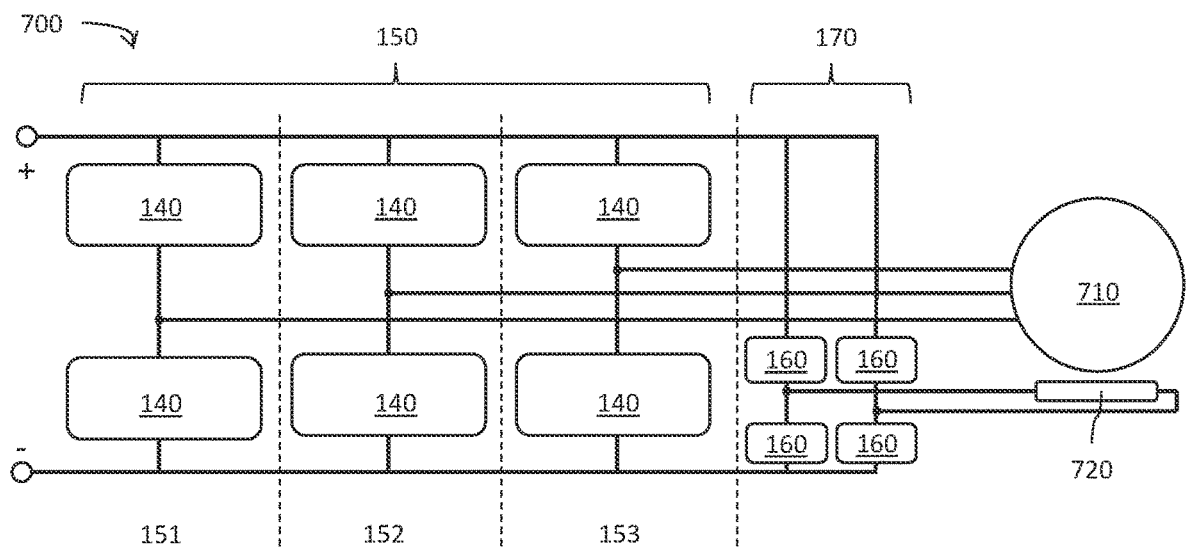
FIG. 7 is a circuit diagram of an exemplary circuitry comprising which may be realized using a power electronics module.

FIG. 7 shows a simplified circuit diagram of an exemplary appliance 700 the power electronics modules 100 to 400 may be a part of. In the example shown in FIG. 7, the higher power part 150 of the power electronics module provides three-phase electric power for an electric motor 710 and the lower power part 170 operates an electromagnet 720. To this end, the higher power part 150 may e.g. comprise a B6-bridge circuit and the first semiconductor dies 140 may e.g. comprise MOSFETs or IGBTs and diodes. The lower power part 170 may e.g. comprise a full-bridge circuit and the second semiconductor dies 160 may e.g. comprise MOSFETs or IGBTs and diodes.

In the following, power electronics modules as well as a method for fabricating power electronics modules are further described using specific examples.

Example 1 is a power electronics module, comprising: at least one first substrate comprising on a first side one or more first semiconductor dies, the one or more first semiconductor dies and the at least one first substrate providing a higher power part of the power electronics module, at least one second substrate comprising on a first side one or more second semiconductor dies, the one or more second semiconductor dies and the at least one second substrate providing a lower power part of the power electronics module, and a common frame at least partially encasing the first and second substrates and being a monobloc part, wherein the higher power part is configured for direct liquid cooling and wherein the lower power part is configured for indirect cooling.

Example 2 is the power electronics module of example 1, further comprising: a baseplate, wherein the at least one first substrate is arranged on a first side of the baseplate and wherein the at least one second substrate is not arranged on the baseplate.

Example 3 is the power electronics module of example 2, wherein a second side of the baseplate, opposite the first side, comprises cooling fins.

Example 4 is the power electronics module of one of the preceding examples, further comprising: a thermal gap pad arranged on a second side of the at least one second substrate, opposite the first side.

Example 5 is the power electronics module of example 4, further comprising: spring elements configured to press the at least one second substrate against the thermal gap pad when the power electronics module is mounted to a heatsink.

Example 6 is the power electronics module of example 5, wherein at least one of the spring elements is also configured to act as an electrical connector coupling the higher power part to the lower power part.

Example 7 is the power electronics module one of the preceding examples, wherein the at least one first substrate is a first type of substrate and wherein the at least one second substrate is a different, second type of substrate.

Example 8 is the power electronics module of one of examples 1 to 6, wherein the at least one first substrate and the at least one second substrate are of an identical type of substrate.

Example 9 is the power electronics module of example 7 or 8, wherein the types of substrate are selected from the group consisting of direct aluminum bond, direct copper bond, active metal brazing, insulated metal substrate and printed circuit board.

Example 10 is the power electronics module of one of the preceding examples, wherein the higher power part comprises a plurality of first substrates arranged laterally next to each other.

Example 11 is the power electronics module of one of the preceding examples, wherein the common frame is a thermoplastic frame.

Example 12 is the power electronics module of one of the preceding examples, wherein the common frame defines at least one cavity, wherein the first and second semiconductor dies are arranged within the at least one cavity, and wherein the at least one cavity is at least partially filled with a protective layer configured to protect the first and second semiconductor dies from the outside.

Example 13 is the power electronics module of one of the preceding examples, wherein during operation a power loss of the higher power part is at least three times higher than a power loss of the lower power part.

Example 14 is the power electronics module of one of the preceding examples, wherein the higher power part is configured to provide three-phase electric power for an electric motor and wherein the lower power part is configured to control an electromagnet.

Example 15 is a method for fabricating a power electronics module, the method comprising: providing at least one first substrate comprising on a first side one or more first semiconductor dies, providing at least one second substrate comprising on a first side one or more second semiconductor dies, and encasing the first and second substrates in a common frame, the common frame being a monobloc part, wherein the one or more first semiconductor dies and the at least one first substrate provide a higher power part of the power electronics module and the one or more second semiconductor dies and the at least one second substrate provide a lower power part of the power electronics module, and wherein the higher power part is configured for direct liquid cooling and the lower power part is configured for indirect cooling.

Example 16 is the method of example 15, further comprising: coupling a second side of the at least one first substrate, the second side being opposite the first side, to a baseplate by soldering, sintering, or welding, and arranging a second side of the at least one second substrate, the second side being opposite the first side, on a thermal gap pad.

Example 17 is the method of example 15 or 16, further comprising: electrically and mechanically coupling the first and second substrates to electrical connectors fitted into the common frame.

Example 18 is the method of example 17, wherein at least some of the electrical connectors are configured as spring elements which exert a downward force onto the first side of the at least one second substrate.

Example 19 is an apparatus comprising means for performing the method according to anyone of the examples 15 to 18.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. A power electronics module, comprising:
    at least one first substrate comprising a first side with one or more first semiconductor dies and a second side opposite the first side, the one or more first semiconductor dies and the at least one first substrate providing a higher power part of the power electronics module;
    at least one second substrate comprising a first side with one or more second semiconductor dies and a second side opposite the first side, the one or more second semiconductor dies and the at least one second substrate providing a lower power part of the power electronics module;
    a baseplate arranged below the at least one first substrate and comprising a first side and a second side opposite the first side, the first side of the baseplate facing the second side of the at least one first substrate, the second side of the baseplate configured to directly contact a cooling fluid in a fluid channel of a heat sink;
    at least one of a thermal gap pad arranged below the at least one second substrate or a layer of a thermal interface material applied to the second side of the at least one second substrate; and
    a common frame at least partially encasing the at least one first substrate and the at least one second substrate and being a monobloc part,
    wherein the at least one first substrate and the at least one second substrate are laterally arranged such that the first side of the at least one first substrate and the first side of the at least one second substrate face away from the baseplate in a same direction.

2. The power electronics module of claim 1, wherein the second side of the baseplate comprises cooling fins.

3. The power electronics module of claim 1, further comprising:
    spring elements configured to press the at least one second substrate against the thermal gap pad when the power electronics module is mounted to the heatsink.

4. The power electronics module of claim 3, wherein at least one of the spring elements is also configured to act as an electrical connector coupling the higher power part to the lower power part.

5. The power electronics module of claim 1, wherein the at least one first substrate is a first type of substrate, and wherein the at least one second substrate is a different, second type of substrate.

6. The power electronics module of claim 5, wherein the types of substrate are selected from the group consisting of direct aluminum bond, direct copper bond, active metal brazing, insulated metal substrate and printed circuit board.

7. The power electronics module of claim 1, wherein the at least one first substrate and the at least one second substrate are of an identical type of substrate.

8. The power electronics module of claim 7, wherein the types of substrate are selected from the group consisting of direct aluminum bond, direct copper bond, active metal brazing, insulated metal substrate and printed circuit board.

9. The power electronics module of claim 1, wherein the higher power part comprises a plurality of first substrates arranged laterally next to each other.

10. The power electronics module of claim 1, wherein the common frame is a thermoplastic frame.

11. The power electronics module of claim 1, wherein the common frame defines at least one cavity, wherein the one or more first semiconductor dies and the one or more second semiconductor dies are arranged within the at least one cavity, and wherein the at least one cavity is at least partially filled with a protective layer configured to protect the one or more first semiconductor dies and the one or more second semiconductor dies from outside.

12. The power electronics module of claim 1, wherein during operation of the power electronics module, a power loss of the higher power part is at least three times higher than a power loss of the lower power part.

13. The power electronics module of claim 1, wherein the higher power part is configured to provide three-phase electric power for an electric motor, and wherein the lower power part is configured to control an electromagnet.

14. The power electronics module of claim 1, wherein the second side of the baseplate is further configured to act as a lid for a cavity of the fluid channel.

15. The power electronics module of claim 1, wherein a lower surface of the at least one of the thermal gap pad or the layer of the thermal interface material is configured to be brought into contact with a wall of the heat sink.

16. A method for fabricating a power electronics module, the method comprising:
    providing at least one first substrate comprising a first side with one or more first semiconductor dies and a second side opposite the first side;
    providing at least one second substrate comprising a first side with one or more second semiconductor dies and a second side opposite the first side;
    providing a baseplate comprising a first side and a second side opposite the first side, the second side configured to directly contact a cooling fluid in a fluid channel of a heat sink;
    providing at least one of a thermal gap pad or a layer of a thermal interface material, a lower surface of the at least one the thermal gap pad or the layer of the thermal interface material configured to be brought into contact with a wall of the heat sink;
    arranging the baseplate below the at least one first substrate such that the first side of the baseplate faces the second side of the at least one first substrate;
    arranging the thermal gap pad below the at least one second substrate or applying the layer of the thermal interface material to the second side of the at least one second substrate;
    arranging the at least one first substrate and the at least one second substrate laterally such that the first side of the at least one first substrate and the first side of the at least one second substrate face away from the baseplate in the same direction; and encasing the at least one first substrate and the at least one second substrate in a common frame, the common frame being a monobloc part, wherein the one or more first semiconductor dies and the at least one first substrate provide a higher power part of the power electronics module, and the one or more second semiconductor dies and the at least one second substrate provide a lower power part of the power electronics module.

17. The method of claim 16, further comprising coupling the second side of the at least one first substrate to the first side of the baseplate by soldering, sintering, or welding.

18. The method of claim 16, further comprising:
electrically and mechanically coupling the at least one first substrate and the at least one second substrate to electrical connectors fitted into the common frame.

19. The method of claim 18, wherein at least some of the electrical connectors are configured as spring elements which exert a downward force onto the first side of the at least one second substrate.

* * * * *